United States Patent [19]
Capps

[11] Patent Number: 5,266,833
[45] Date of Patent: Nov. 30, 1993

[54] INTEGRATED CIRCUIT BUS STRUCTURE

[76] Inventor: David F. Capps, 134 Moross, Mt. Clemens, Mich. 48043

[21] Appl. No.: 859,664

[22] Filed: Mar. 30, 1992

[51] Int. Cl.$^5$ .................. H01L 23/528; H01L 23/538
[52] U.S. Cl. ...................... 257/690; 257/691; 257/694
[58] Field of Search ............... 257/723, 725, 690, 691, 257/698, 666, 685, 686, 694, 695, 773

[56] References Cited

U.S. PATENT DOCUMENTS

| | | | |
|---|---|---|---|
| 4,437,141 | 3/1984 | Prokop | 361/403 |
| 4,580,193 | 4/1986 | Edwards | 361/407 |
| 4,597,029 | 6/1986 | Kucharek et al. | 361/407 |
| 4,603,927 | 8/1986 | Gardner | 361/407 |
| 4,640,436 | 2/1987 | Miyoshi et al. | 220/359 |
| 4,774,635 | 9/1988 | Greenberg et al. | 361/404 |
| 4,859,808 | 8/1989 | Jeter et al. | 361/404 |
| 4,868,712 | 9/1989 | Woodman | 361/388 |
| 4,874,722 | 10/1989 | Bednarz et al. | 437/209 |
| 4,922,269 | 5/1990 | Ikeda et al. | 361/408 |
| 4,956,694 | 9/1990 | Eide | 257/723 |
| 4,965,653 | 10/1990 | Otsuka et al. | 257/750 |
| 4,975,763 | 12/1990 | Baudouin et al. | 361/404 |
| 4,992,849 | 2/1991 | Corbett et al. | 361/400 |
| 4,992,850 | 2/1991 | Corbett et al. | 361/400 |
| 5,019,945 | 5/1991 | Smolley | 361/412 |
| 5,031,072 | 7/1991 | Malhi et al. | 257/723 |
| 5,061,988 | 10/1991 | Rector | 361/404 |
| 5,066,831 | 11/1991 | Spielberger et al. | 361/412 |
| 5,068,714 | 11/1991 | Seipler | 361/400 |
| 5,135,556 | 8/1992 | Hornback et al. | 257/723 |
| 5,138,438 | 8/1992 | Masayuki et al. | 257/723 |

FOREIGN PATENT DOCUMENTS 0160641 8/1985 Japan ................................. 257/723

Primary Examiner—Rolf Hille
Assistant Examiner—Peter Toby Brown
Attorney, Agent, or Firm—Basile and Hanlon

[57] ABSTRACT

An integrated bus structure forms a multi-bit, parallel electrical signal bus between a plurality of integrated circuit dies. In one embodiment, the integrated circuit dies are disposed in a spaced, parallel arrangement and have terminal pads mounted at peripheral edges thereof and disposed in a predetermined positional and functional relationship. Electrical conductors interconnect the same positionally arranged terminal pad on each of the plurality of integrated circuit dies to form a parallel, multi-bit, bus arrangement. In another embodiment, at least one integrated circuit is mounted on a support member. The mounting pads on each integrated circuit die are electrically connected to terminal pads formed on the peripheral edge of each support member. Electrical conductors interconnect the same positionally arranged terminal pad on each of a plurality of support members to interconnect the integrated circuit dies on each support member in a parallel bus arrangement.

9 Claims, 3 Drawing Sheets

INTEGRATED CIRCUIT BUS STRUCTURE

BACKGROUND OF THE INVENTION

The present invention relates, in general, to integrated circuits and, more specifically, to interconnection of integrated circuits in a parallel, electrical signal bus structure.

Integrated circuits, such as computer and memory chips, are formed on a die that is cut in a thin slice from a semiconductor material crystal. Electrically conductive bonding pads are formed on each die to facilitate the connection of the die to other integrated circuits to form various electronic circuits. Interconnection of numerous dies together into an electronic circuit requires several different levels of electrical conductors. In a first level, bonding wires are mounted on and extend from the bonding pads on the die to larger pads formed on a substrate. Electrically conductive surface traces in the substrate form the second level of conductors and extend from the pads on the substrate connected to the bonding wires to external pins which extend outward from the integrated circuit housing package. The pins form a third level of conductors as they are typically mounted in sockets in a printed circuit board and soldered in place to form a part of an electronic circuit on the printed circuit board.

Many electronic devices, such as computers, are not limited to one printed circuit board, but require multiple boards for large memory capacity, input/output functions, graphic display interfaces, modems, etc. Such multiple printed circuit boards are typically interconnected by some type of backplane wiring. One conventional type of backplane wiring utilizes a large printed circuit board, commonly known as a "motherboard," which has edge card connectors which receive plug-in edge terminals formed on the printed circuit boards containing the integrated circuits and connected to conductive surface tracings on each printed circuit board. Computer data and address lines are arranged in parallel in a "bus" and extend from the integrated circuit dies on each printed circuit board through the backplane wiring to other integrated circuits on other printed circuit boards to form a continuous electrical signal bus extending throughout the entire group of multiple printed circuit boards.

Another type of backplane wiring also utilizes edge card connectors, but, in this arrangement, the edge card connectors on each printed circuit board are interconnected by cable harnesses extending between each printed circuit board.

Regardless of its specific arrangement, the purpose of the backplane wiring is to connect individual integrated circuit dies mounted on printed circuit boards to integrated circuit dies on other printed circuit boards for use in a particular electronic circuit. However, such conventional backplane wiring structures to form electrical signal parallel buses result in a large size and weight for a complete electronic circuit or device. Overall size and weight are major considerations in any electronic device; but are particularly important in military applications as well as commercial applications where small size and weight for easy portability are desirable characteristics.

Thus, it would be desirable to provide an apparatus for interconnecting one integrated circuit die to another in an efficient size and weight manner. It would also be desirable to provide an integrated circuit parallel bus structure which interconnects a plurality of integrated circuit dies in a parallel bus arrangement.

SUMMARY OF THE INVENTION

The present invention is an integrated circuit bus structure which interconnects a plurality of integrated circuit dies into a parallel electrical signal bus structure for use in computers and other data communication applications.

In one embodiment, the integrated circuit bus structure includes a plurality of integrated circuit dies disposed in a spaced, parallel arrangement. Each integrated circuit die includes a plurality of terminal pads disposed on the peripheral edges of each die and electrically connected to the circuitry forming the integrated circuit on each die. The terminal pads on each integrated circuit die are arranged in a predetermined location which is identical to all of the integrated circuit dies and, further, are disposed in a predetermined bus order on all of the dies to form a predetermined parallel electrical signal bus arrangement for electrical signal communication to and from each integrated circuit die. An electrical conductor means is disposed in electrical signal communication with at least certain of the terminal pads on certain of the integrated circuit dies to form a parallel, multi-bit, bus structure interconnecting each of the integrated circuit dies.

In one embodiment, the electrical conductor means comprises a plurality of rigid, planar, rail-like electrical conductors extending across at least certain of the peripheral edges of the spaced, parallel arrangement of integrated circuit dies. Each of the rail-like electrical conductors is disposed in electrical signal contact with one terminal pad on each integrated circuit die, which terminal pad is located at the same position and provides the same electrical signal for each integrated circuit die. Electrical insulating members are disposed between each integrated circuit die and between each rail-like electrical conductor.

The terminal pads on each integrated circuit die, which are formed during the formation of each die, extend across the peripheral edge of at least certain and, preferably, all of the peripheral edges of each integrated circuit die to provide an easy means for signal contact with the electrical conductor means.

This embodiment eliminates the backplane wiring utilized in conventional computer systems to interconnect multiple printed circuit boards containing a number of integrated circuit dies in a parallel electrical signal bus extending through all of the printed circuit boards and the integrated circuit dies. More importantly, the integrated circuit bus structure described above eliminates several levels of electrical conductors previously required in forming and mounting integrated circuit dies in larger electronic circuits. In this embodiment, the integrated circuit dies are directly connected to the electrical conductor means thereby eliminating the need for bonding wires and an integrated circuit die substrate with terminal pins and pads connected to the bonding wires. Further, edge card connectors between the printed circuit boards containing one or more integrated circuit dies and a backplane motherboard are also eliminated. This results in an electronic device which has a small size and weight thereby finding advantageous use in applications requiring portability, small size and light weight. Further, the integrated circuit bus structure of the present invention reduces the cost of constructing electronic circuits due to the elimination of several levels of electrical interconnections and conductors.

In another embodiment, the present invention is usable with conventional integrated circuits without requiring the relocation of the terminal pins of such integrated circuits to a predetermined location on the edge of each integrated circuit die. In this embodiment, a plurality of electrically insulating support members are arranged in a spaced, parallel arrangement. At least one integrated circuit die having a plurality of mounting pads disposed adjacent its peripheral edges are mounted on each support member. Bonding wires extend from the mounting pads on each integrated circuit die to corresponding conductive pads on each support member. The substrate pads are connected via surface traces on each support member to peripherally located terminal pads disposed on and extending across the peripheral edges of each support member. The terminal pads on each support member are arranged in a predetermined location to form a parallel electrical signal bus arrangement extending across the plurality of spaced, support members. Electrical conductor means are provided for interconnecting the same terminal pad on each support member to form a parallel electrical signal bus extending over the support members.

This second embodiment affords substantially all of the advantages of the first described embodiment; but does not require the redesign of conventional integrated circuit dies. The standardized location of terminal pads on the support members are provided only on the support members, with surface tracings and bonding wires being provided to interconnect such terminal pads with the mounting pads on conventional integrated circuit dies which are mounted on each support member.

BRIEF DESCRIPTION OF THE DRAWING

The various features, advantages and other uses of the present invention will become more apparent by referring to the following detailed description and drawing in which.

DESCRIPTION OF THE PREFERRED EMBODIMENTS

Figure 1:
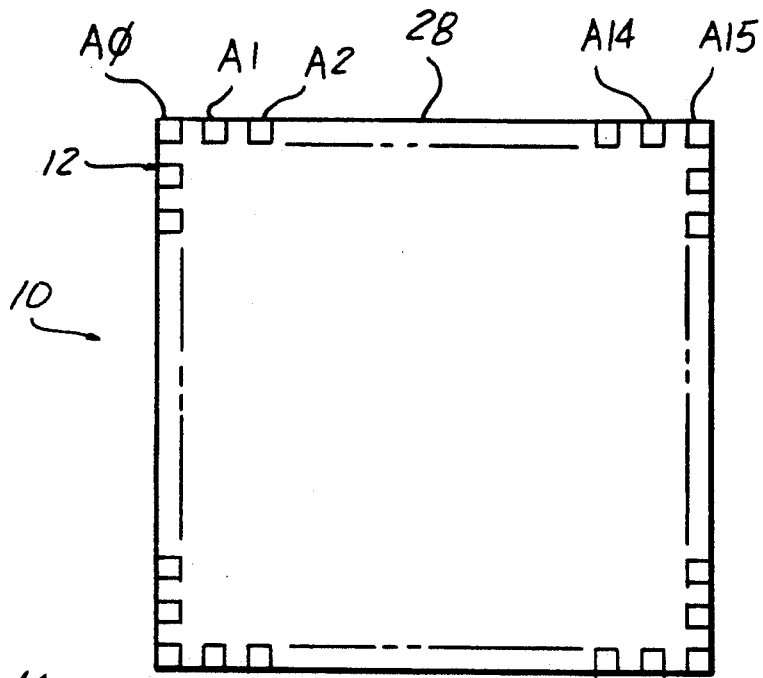
FIG. 1 is a plan view of an integrated circuit die constructed in accordance with the teachings of one embodiment of the present invention.

Referring now to the drawing, and to FIGS. 1-5 in particular, there is illustrated one embodiment of an integrated circuit bus structure useful in interconnecting a plurality of integrated circuit dies or chips in a parallel, electrical signal, multi-bit bus for signal communication between the various integrated circuit dies.

In FIG. 1, an integrated circuit die 10 is depicted for use in the integrated circuit bus structure of the present invention. The integrated circuit die or chip 10 is of conventional construction in that an integrated circuit of any type, such as a microprocessor, computer memory, input/output signal converters, etc., are formed on a thin slice of a semiconductor material, such as silicon or germanium. The integrated circuit die 10 has top and bottom major surfaces and four peripheral edges. Further, the die 10 may have any shape, such as square, rectangular, etc., as well as any size to meet the circuit density requirements for a particular electronic application.

A plurality of terminal pads denoted generally by reference number 12 are formed on the peripheral edge of the integrated circuit die 10. The terminal pads 12 are formed so as to extend across the peripheral edge of the integrated circuit die between the top and bottom major surface of the die 10 and are open to the peripheral edge of the die 10.

Figure 2:
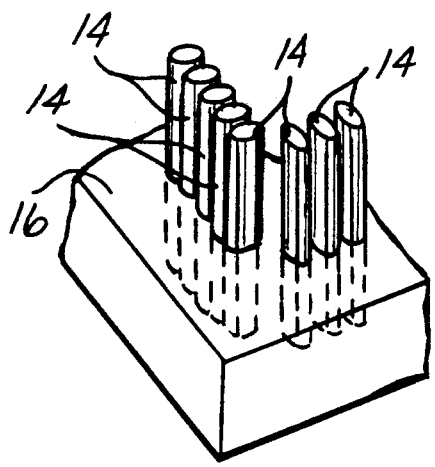
FIG. 2 is a partial, pictorial view depicting the mounting of the terminal pad forming wires in a semiconductor material crystal.

The terminal pads 12 may be formed in any suitable manner. As shown in FIG. 2, in an exemplary embodiment, a plurality of thin electrically conductive wires 14 formed of a suitable electrical conductive material, such as copper or gold, are disposed in a spaced, grid arrangement in a semiconductor material during the growth of a semiconductor crystal 16. This insures that the wires 14 are mechanically bonded to the semiconductor crystal 16.

Figure 3:
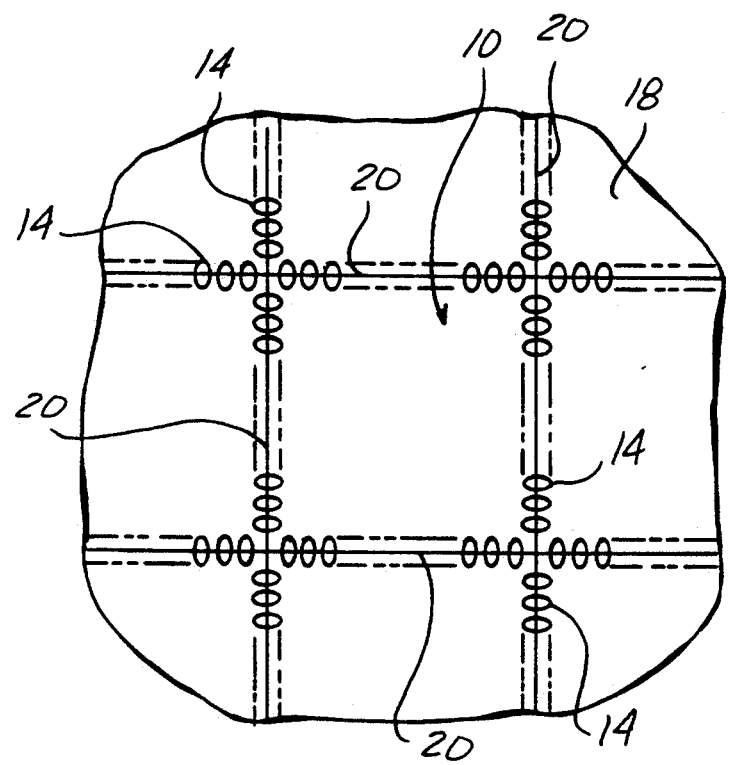
FIG. 3 is a schematic representation of the cutting lines and terminal pad locations on a semiconductor wafer cut from the crystal shown in FIG. 2, and showing the formation of integrated circuit dies according to the first embodiment.
Figure 4:
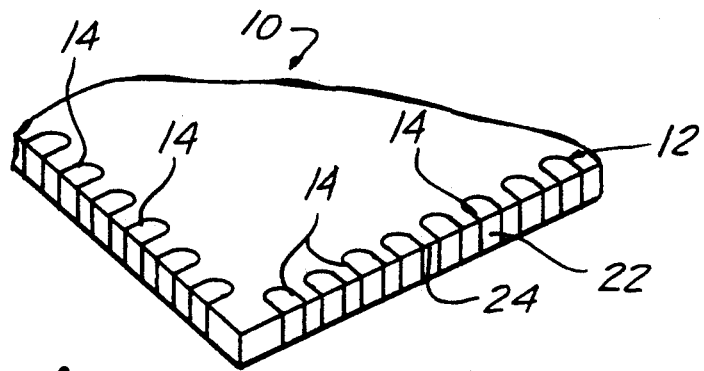
FIG. 4 is a partial, perspective view showing the terminal pad arrangement on an integrated circuit die according to the first embodiment of the present invention.

As is well known, a thin slice or wafer is cut from the crystal 16 as partially shown by reference number 18 in FIG. 3. A plurality of identical integrated circuits are formed on the wafer 18 in a conventional, known manner. The wires 14 are formed in intersecting, grid-like rows so as to be disposed at the periphery of each integrated circuit die 10. The individual integrated circuit dies, such as integrated circuit die 10, are cut from the wafer 18 along cut lines 20. Such cut lines 20 pass through the wires 14 such that a portion of each wire 14 is exposed at the peripheral edges of each integrated circuit formed by each cut line 20. This results in the terminal pad 12 arrangement shown in FIG. 4 in which a portion of the wires 14 are spaced apart along each of the peripheral edges of each integrated circuit die 10. It will be understood that the terminal pads 12 may be formed on less than all of the peripheral edges as needed to meet the requirements of a particular circuit application. As shown in FIG. 4, a portion 22 of each metal wire 14 forming each terminal pad 12 is exposed along the peripheral edge 24 of each integrated circuit die 10.

According to the present invention the terminal pads 12 formed on and extending across certain or all of the peripheral edges of each integrated circuit die 10 are assigned to a common electrical signal data communication function and are identically arranged on each integrated circuit die used in the integrated circuit bus structure of the present invention. For example, as shown in FIG. 1, the terminal pads 12 formed on one peripheral edge 28 of the integrated circuit die 10 are assigned to parallel address lines in an electrical signal bus. These address lines A0, A1, A2 . . . A14, A15 provide a sixteen bit address bus for communication between a number of like integrated circuit dies 10. The number of terminal pads 12 on each peripheral edge may be provided in any other number, such as 8, 32, 64, etc., depending upon the overall size of the integrated circuit die 10 and the requirements of a particular electronic circuit application. Further, the function of the terminal pads 12 on each peripheral edge, such as peripheral edge 28 of the integrated circuit die 10, may provide other signal functions, such as data signal lines, etc. What is important is that the signal functions of the terminal pads on a particular peripheral edge of each integrated circuit die and the location of each terminal pad providing a particular signal function on each peripheral edge is the same for each of the integrated circuit dies 10 used in the integrated circuit bus structure of the present invention.

Figure 5:
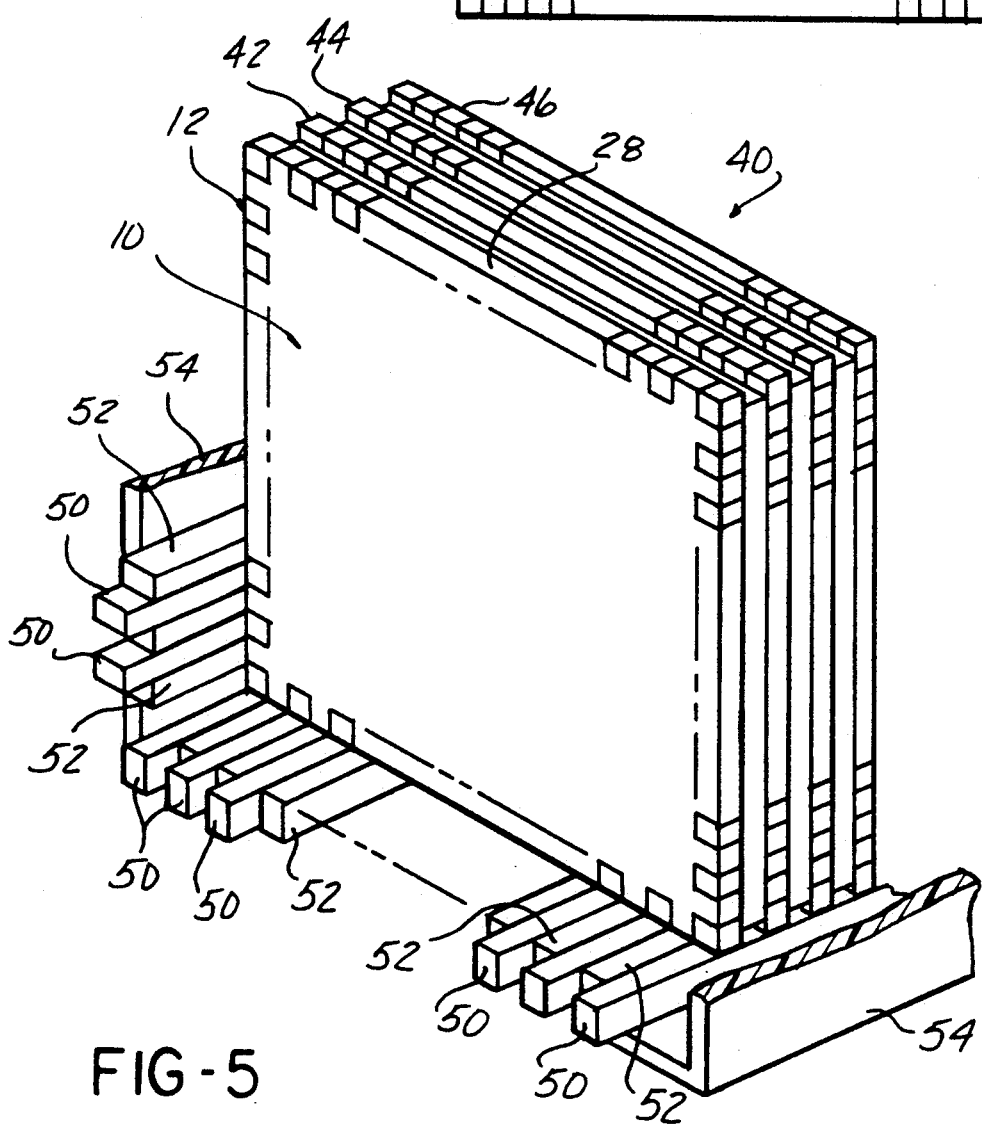
FIG. 5 is a perspective view showing the parallel arrangement of a plurality of integrated circuit dies shown in FIG. 1 and interconnected by electrical conductors in a parallel bus structure.

Such an integrated bus structure is shown in FIG. 5 and denoted in general by reference number 40. In this bus structure 40, a plurality of integrated circuit dies 10, 42, 44, 46, etc., are arranged in a spaced, parallel arrangement. Each of the dies 10, 42, 44 and 46, which may be provided in any number, have the same, identical overall size and shape. However, the circuit function on each die 10, 42, 44 and 46 may be the same or different. The only requirement for each integrated circuit die employed in the bus structure 40 is that the function and location of the terminal pads along the same peripheral edge of each of the dies 10, 42, 44 and 46 is identical. Thus, if the terminal pads along the peripheral edge 28 of the integrated circuit die 10 have the address line functions described above and shown in FIG. 1, then the terminal pads along the same corresponding peripheral edge of the adjacent integrated circuit dies 42, 44 and 46 will also have the same address data communication line function. All of the terminal pads providing the address line data bus function will thus be arranged in a spaced, parallel, colinear arrangement as shown in FIG. 5.

The terminal pads along other peripheral edges of the parallel arranged integrated circuit dies 10, 42, 44 and 46 may have other assigned signal functions, such as data bus lines, input/output selection lines, etc.

The integrated bus structure 40 includes electrical conductor means, disposed in electrical signal communication with at least certain of the terminal pads on the plurality of integrated circuit dies 10, 42, 44 and 46, to form a multi-bit, parallel signal bus interconnecting the terminal pads on each of the plurality of integrated circuit dies 10, 42, 44 and 46.

In one embodiment, the electrical conductor means includes a plurality of electrically conductive, planar, rail-like, rigid members 50 which have a predetermined length so as to extend across all of the integrated circuit dies used in the integrated bus structure 40. The electrical conductors 50 are formed of an electrically conductive material, such as copper or gold, and are insulated from each other by strip-like insulator members 52 disposed between adjacent electrical conductors 50.

In this manner, each of the electrical conductors 50 extends across and electrically contacts one terminal pad on each of the integrated circuit dies 42, 44 and 46. As each particular terminal pad on each of the integrated circuit dies 10, 42, 44 and 46 is provided with the same electrical signal function, as described above, the use of the electrical conductors 50 thus places the same terminal pad on each of the integrated circuit dies 10, 42, 44 and 46 in parallel signal communication with identically located terminal pads on adjacent dies. The use of a number of spaced, parallel electrical conductors 50 forms a multi-bit electrical signal communication bus across all of the integrated circuit dies 10, 42, 44 and 46 for signal communication between the integrated circuits on each die 10, 42, 44 and 46.

A suitable frame is provided for securely mounting the electrical conductors 50 and the insulator strips 52 to the integrated circuit dies 10, 42, 44 and 46. The frame may take any shape and, as shown in an exemplary embodiment in FIG. 5, includes insulator edge members 54 which extend across and surround the outer surface of the electrical conductors 50 and the insulator strips 52. Any suitable frame structure may be provided to securely retain the electrical conductors and integrated circuit dies in electrical contact and in the prescribed positional relationship as well as to provide for removal or insertion of the dies into the integrated bus structure 40.

Finally, depending upon the needs of a particular application, the entire frame, integrated circuit dies 10, 42, 44 and 46, interconnecting electrical conductors 50 and the insulator strips 52 may be encapsulated to protect the circuitry of integrated bus structure 40.

Figure 6:
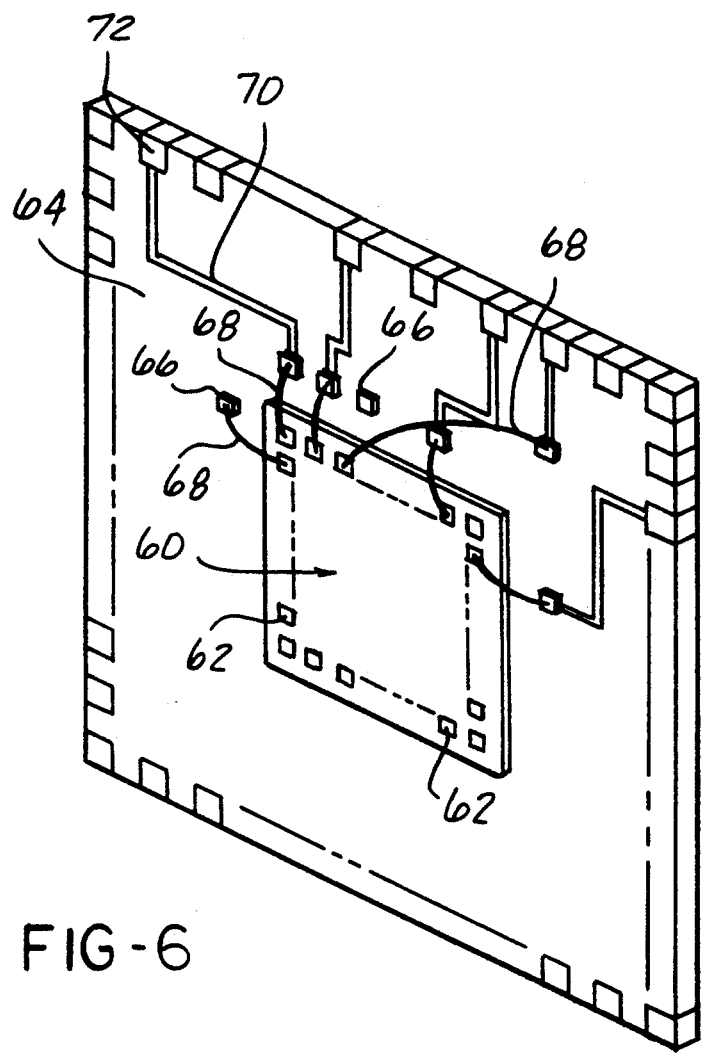
FIG. 6 is a perspective view of another embodiment of an integrated circuit die and support member according to the present invention.

Another embodiment of the present invention is shown in FIG. 6. In this embodiment, the same integrated circuit bus structure is provided; but conventional integrated circuit dies may be employed without repositioning the terminal pads on the integrated circuit dies into a prescribed, positional relationship as described above. As shown in FIG. 6, reference number 60 depicts a conventional integrated circuit die which may provide any function, such as a microprocessor, computer memory, etc. As is well known, such a die 60 includes mounting pads 62 formed on one surface and located adjacent to the peripheral edge of the die 60.

A support member 64 formed of an electrically insulating material is provided for one or a plurality of integrated circuit dies 60, with each integrated circuit die 60 being securely mounted to one surface of the support member 64 in a conventional manner. Although only one integrated circuit die 60 is shown mounted on the support member 64, it will be understood that multiple integrated circuit dies 60 may be mounted on a single support member to meet the requirements of a particular application.

A plurality of wire bonding pads 66 are formed on one surface of the support member 64 and disposed about the periphery of the integrated circuit die 60. Bonding wires 68 connect one bonding pad 62 on the integrated circuit die 60 to one bonding wire pad 66 on the support member 64. Additional conductors, typically in the form of conductive surface traces 70, are formed in the support member 64 and extend from each wire bonding pad 66 to a peripheral edge mounted terminal pad 72. The terminal pad 72 is formed in the same manner as the terminal pads 12 described above and extends across and is open over the peripheral edge of the support member 64. The surface traces 70 may be formed in any desired configuration depending upon the density of the wire bonding pads 66 and the number of terminal pads 72 required for each support member 64.

As in the first embodiment, the terminal pads 72 are arranged in a predetermined positional relationship on the peripheral edge of each support member 64. Each terminal pad 72 has a preassigned signal function, such as an address line, a data line, etc., which forms one bit of a parallel bus signal communication path. Informing the bus structure in this embodiment, a plurality of identical size and shape support members 64, each having one or more integrated circuit dies 60 mounted thereon and connected via wire bonding pads 66, bonding wires 68, and surfaces traces 70 to terminal pads 72, are arranged in a spaced, parallel relationship and interspersed with electrically insulating members. This places each of the terminal pads 72 having the same identical signal function in a colinear arrangement extending across the peripheral edges of the plurality of spaced, parallel support members 64 in the same manner as described in the first embodiment of the present invention.

Electrical conductors, not shown, in the form of planar, rail-like members 50 described above, are then disposed in contact with each of the terminal pads, such as the terminal pads 72, on the support members 64 to form a parallel, multi-bit electrical signal communication bus extending across all of the support members 64. Such electrical conductors 50 and terminal pads 72 may extend across one or all of the peripheral edges of each support member 64. A frame, such as the frame 54 shown in FIG. 5, is provided for interconnecting the support member 64 and the electrical conductors 50 in a secure structure.

Figure 7:
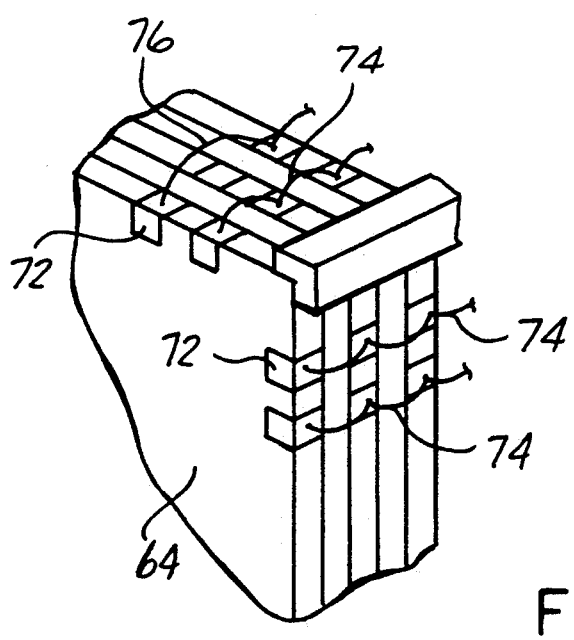
FIG. 7 is a partial, perspective view showing another embodiment of an electrical conductor means for interconnecting terminal pads on adjacent, integrated circuit dies shown in FIG. 5 or the terminal pads on adjacent support members as shown in FIG. 6.

Another embodiment of an electrical conductor means which may be employed for interconnecting identical function terminal pads on each of the plurality of parallel, spaced support members 64 is shown in FIG. 7. In this embodiment, the electrical conductor means comprises individual bonding wires or jumpers 74 which are individually joined to identical function terminal pads on each of the support members 64. The bonding wires 74 may extend from terminal pads on each adjacent support member or may be connected to selected terminal pads on selected, non-adjacent support members 64, as shown for bonding wire 76 in FIG. 7, depending upon the function of the particular integrated circuit mounted on a particular support member 64. It will be understood that the bonding wires 74 shown in FIG. 7 may also be employed as the electrical conductors in the first embodiment of the integrated bus structure 40 of the present invention shown in FIG. 5 in place of the rigid, rail-like electrical conductors 50.

In summary, there has been disclosed a unique integrated bus structure which significantly reduces the size and weight of computers requiring parallel signal buses for data, address and other signal communication. The integrated bus structure of the present invention is simple to manufacture and, in one embodiment, does not require any modifications to existing integrated circuit dies.

What is claimed is:

1. A bus structure for an electronic system formed of a plurality of discrete integrated circuits performing different and at least certain of data processing, addressing, memory, and input/output signal conditioning functions, the bus structure comprising:
   a plurality of semiconductor integrated circuit dies each having first and second opposed major surfaces and a peripheral edge formed therebetween, the plurality of integrated circuit dies disposed in a spaced, parallel arrangement;
   integrated circuitry formed on each integrated circuit die for performing at lest one of data processing, addressing, memory and input/output signal conditioning functions, the integrated circuitry differing on at least certain of the integrated circuit dies;
   each of the integrated circuit dies including a plurality of terminal pads disposed on the peripheral edge thereof and electrically connected to the integrated circuitry on each integrated circuit die;
   the terminal pads on each integrated circuit die being arranged in a predetermined, positional electrical signal bus arrangement identical for all of the integrated circuit dies in the electronic system for electrical signal communication to and from each of the plurality of integrated circuit dies; and
   electrical conductor means, disposed in electrical signal communication with at least certain of the terminal pads on certain of the integrated circuit dies, to form a multi-bit, parallel bus interconnecting each of the plurality of integrated circuit dies in the electronic system.

2. The bus structure of claim 1 further including:
   electrical insulator members disposed between adjacent ones of the integrated circuit dies.

3. The bus structure of claim 1 wherein the electrical conductor means comprises:
   a plurality of rigid, planar, electrical conductors, each spanning and contacting the same one positionally located terminal pad on each of the integrated circuit dies.

4. The bus structure of claim 3 further including:
   electrical insulator members disposed between adjacent electrical conductors.

5. The bus structure of claim 1 wherein the electrical conductor means extends over a portion of the peripheral edge of each of the integrated circuit dies.

6. The bus structure of claim 1 wherein the electrical conductor means extends over substantially all of the peripheral edge of each of the integrated circuit dies.

7. The bus structure of claim 1 wherein:
   the terminal pads are integrally formed with each integrated circuit die and extend across the peripheral edge of each integrated circuit die.

8. An integrated circuit bus structure comprising:
   a plurality of semiconductor integrated circuit dies each having first and second opposed major surfaces and a peripheral edge formed therebetween, the plurality of integrated circuit dies disposed in a spaced, parallel arrangement;
   each of the integrated circuit dies including a plurality of terminal pads disposed on the peripheral edge thereof and electrically connected to the circuitry on each integrated circuit die;
   the terminal pads on each integrated circuit die being arranged in a predetermined, positional electrical signal bus arrangement identical for all of the integrated circuit dies for electrical signal communication to and from each of the plurality of integrated circuit dies, the terminal pads being exposed to a top and a bottom surface of each integrated circuit die; and
   electrical conductor means, disposed in electrical signal communication with at least certain of the terminal pads on certain of the integrated circuit dies, to form a multi-bit, parallel bus interconnecting each of the plurality of integrated circuit dies.

9. An integrated circuit bus structure comprising:
   a plurality of semiconductor integrated circuit dies each having first and second opposed major surfaces and a peripheral edge formed therebetween, the plurality of integrated circuit dies disposed in a spaced, parallel arrangement;

each of the integrated circuit dies including a plurality of terminal pads disposed on the peripheral edge thereof and electrically connected to the circuitry on each integrated circuit die;

the terminal pads including electrically conductive pads mounted on the peripheral edges of each integrated circuit die and extending from a top to a bottom surface of each integrated circuit die and over the peripheral edge of each integrated circuit die;

the terminal pads on each integrated circuit die being arranged in a predetermined, positional electrical signal bus arrangement identical for all of the integrated circuit dies for electrical signal communication to and from each of the plurality of integrated circuit dies; and electrical conductor means, disposed in electrical signal communication with at least certain of the terminal pads on certain of the integrated circuit dies, to form a multi-bit, parallel bus interconnecting each of the plurality of integrated circuit dies.

* * * * *